United States Patent [19]

Kenney

[11] Patent Number: 5,264,716
[45] Date of Patent: Nov. 23, 1993

[54] DIFFUSED BURIED PLATE TRENCH DRAM CELL ARRAY

[75] Inventor: Donald M. Kenney, Shelburne, Vt.

[73] Assignee: International Business Machines Corporation, Armonk, N.Y.

[21] Appl. No.: 819,148

[22] Filed: Jan. 9, 1992

[51] Int. Cl.⁵ ............... H01L 27/108; H01L 29/76; H01L 29/00; H01G 4/06
[52] U.S. Cl. ............... 257/301; 257/304; 257/311; 257/390; 257/544; 361/313
[58] Field of Search ............... 257/296, 301, 304, 311, 257/390, 544, 532, 379; 361/313; 437/52

[56] References Cited

U.S. PATENT DOCUMENTS

| | | | |
|---|---|---|---|
| 4,688,063 | 8/1987 | Lu et al. | 357/23.6 |
| 4,728,623 | 3/1988 | Lu et al. | 437/52 |
| 4,794,434 | 12/1988 | Pelley | 357/23.6 |
| 4,801,988 | 1/1989 | Kenney | 357/23.6 |
| 4,829,017 | 5/1989 | Malhi | 437/47 |
| 4,873,205 | 10/1989 | Critchlow et al. | 437/52 |
| 4,873,560 | 10/1989 | Sunami et al. | 357/23.6 |
| 4,912,054 | 3/1990 | Tomassetti | 437/31 |
| 4,918,502 | 4/1990 | Kaga et al. | 357/23.6 |
| 4,922,313 | 5/1990 | Tsuchiya | 257/301 |
| 4,927,779 | 5/1990 | Dhong et al. | 437/52 |
| 4,944,682 | 7/1990 | Cronin et al. | 437/192 |
| 4,988,637 | 1/1991 | Dhong et al. | 437/52 |

FOREIGN PATENT DOCUMENTS

| | | | |
|---|---|---|---|
| 0224213 | 6/1987 | European Pat. Off. | 257/301 |
| 0283964 | 9/1988 | European Pat. Off. | 257/304 |
| 0298421 | 1/1989 | European Pat. Off. | 257/301 |
| 0384396 | 8/1990 | European Pat. Off. | 257/370 |
| 1-119057 | 5/1989 | Japan | 257/301 |
| 2-28367 | 1/1990 | Japan | 257/301 |
| 2-62070 | 3/1990 | Japan | 257/301 |
| 2-135776 | 5/1990 | Japan | 257/301 |
| 2199695 | 7/1988 | United Kingdom | 257/301 |
| 2215913 | 9/1989 | United Kingdom | 257/304 |

OTHER PUBLICATIONS

IBM Technical Disclosure Bulletin, vol. 31, No. 12 May 1989, "Three-Dimensional Single-Crystal Dynamic RAM Cell", pp. 302-304.
"Trench and Compact Structures for DRAMs" by P. Chatterjee et al, International Electron Devices Meeting 1986, Technical Digest paper 6.1, pp. 128-131.
"CMOS Semiconductor Memory Structural Modification to Allow Increased Memory Charge" Anonymous, IBM Technical Disclosure Bulletin, vol. 31, No. 11, Apr. 1989, pp. 162-165.
"A 45-ns 16Mb DRAM with Triple-Well Structure" by S. Fujii et al, IEEE Journal of Solid-State Circuits, vol. 24, No. 5, Oct. 1989, pp. 1170-1175.
"New Well Structure for Deep Sub-micron CMOS/BiCMOS Using Thin Epitaxy over Buried Layer and Trench Isolation" by Y. Okazaki et al, 1990 Symposium on VLSI Technology, Digest of Technical Papers, paper 6C-4, pp. 83-84.

Primary Examiner—Rolf Hille
Assistant Examiner—Steven Loke
Attorney, Agent, or Firm—Howard J. Walter, Jr.

[57] ABSTRACT

A high density substrate plate DRAM cell memory device is described in which a buried plate region is formed adjacent to deep trench capacitors such that the substrate region of DRAM transfer FETs can be electrically isolated from other FETs on a semiconductor substrate. The buried region is partially formed by lateral outdiffusion from the sidewalls of the deep trenches and partially formed by an N-well surface diffusion which entirely surrounds the DRAM array region.

9 Claims, 6 Drawing Sheets

DIFFUSED BURIED PLATE TRENCH DRAM CELL ARRAY

RELATED APPLICATIONS

This application is related to co-pending applications Ser. Nos. 07/819,159 and 07/818,668 filed concurrently herewith and entitled "Double Grid Substrate Plate Trench DRAM Cell Array" by J. Park et al. and "Double Well Substrate Plate Trench DRAM Cell Array" by G. B. Bronner et al., respectively.

BACKGROUND OF THE INVENTION

1. Field of the Invention

This invention relates to semiconductor memory devices and particularly to high density dynamic random access memory cells and methods for their manufacture in sub-micron technologies.

2. Description of the Prior Art

Designers of technologies for producing semiconductor devices have been continually pressure to increase effective device densities in order to remain cost and performance competitive. As a result, VLSI and ULSI technologies have entered the sub-micron realm of structural dimensions and now are designing technologies in the nanometer feature size range. In the foreseeable future absolute atomic physical limits will be reached in the conventional two-dimensional design approach to semiconductor device design. Traditionally, Dynamic Random Access Memory (DRAM) designers have met the severest of challenges in advancing technologies by pushing the limits of feature size resolution with each generation of DRAM. For example, designers of 64 K bit DRAMs were perplexed to learn that a practical physical limit to charge capacity of storage capacitors had already been reached due to the minimum charge capacity required to allow reliable data signal sensing in the presence of naturally occurring atomic particle radiation inherently present in fabrication materials and the operating environment. Storage capacitors in the range of about 50 femtofarads are now considered to be a physical limit. From a practical view, this limitation prevented a continuation of the scaling of DRAM dimensions and voltages initiated in the early 1970s. Reduction in the surface area of semiconductor substrate utilized by the DRAM storage capacitor has been severely restricted. Due to decreases in the thickness of reliable capacitor dielectric materials, existing 1 Megabit (1 Mb) DRAM technologies continue to enjoy the freedom of planar, two-dimensional device and circuit design. Beginning with 4 Mb DRAMs, the world of three-dimensional design has been utilized to the extent that the simple single device/capacitor memory cell has been altered to provide the capacitor in a vertical dimension. In such designs, the capacitor has been formed in a trench formed in the surface of the semiconductor substrate. In yet denser designs, other forms of three-dimensional capacitors have been proposed, such as stacking the plates of the capacitor above the transfer device. Such designs, however, present difficulties in forming the interconnections to the required word access and data bit lines to the DRAM memory cell. Additional designs have been proposed in which the transfer device and its associated capacitor are both formed within a trench of preferably minimum feature size. Currently, insurmountable processing difficulties make such designs impractical for product manufacturing processes.

A large number of proposals for 16 Mb and greater density DRAM cell designs have avoided continuing development of trench cell technology because of the existence of charge leakage mechanisms known to be present in trench capacitor structures. As these leakage mechanisms have become known, extensions of trench DRAM cells designs have been used successfully in 16 Mb designs.

The following references describe various aspects of prior art techniques used in DRAM and other semiconductor technologies.

The article "Trench and Compact Structures for DRAMs" by P. Chatterjee et al., International Electron Devices Meeting 1986, Technical Digest paper 6.1, pp. 128-131, describes variations in trench cell designs through 16 Mb DRAM designs, including the Substrate Plate Trench (SPT) cell described in more detail in U.S. Pat. No. 4,688,063 issued Aug. 18, 1987 to Lu et al. and assigned to the assignee of the instant invention. The SPT cell uses a highly conductive substrate as the DRAM cell plate. The storage node of each cell is formed in a deep trench in the substrate. U.S. Pat. No. 4,801,988 issued Jan. 31, 1989 to Kenney and assigned to the assignee of the instant invention, describes an improved SPT cell which includes a thick isolation region formed within the trench to enable higher density packing of DRAM cells. The article "CMOS Semiconductor Memory Structural Modification to Allow Increased Memory Charge" anonymous, IBM Technical Disclosure Bulletin, Vol. 31, No. 11, April 1989, pp. 162-5, teaches a method of isolating the substrate plate of an SPT cell from support devices by providing a buried region under support devices in order to allow the plate reference voltage to be separately biased at an optimum Vdd/2 volts.

U.S. Pat. No. 4,912,054 issued Mar. 27, 1990 to Tomassetti describes methods of isolating bipolar-CMOS circuit devices through the use of various epitaxial layers as commonly found in bipolar device technologies. The article "A 45-ns 16-Mb DRAM with Triple-Well Structure" by S. Fujii et al., IEEE Journal of Solid-State Circuits, Vol. 24, No. 5, October 1989, pp. 1170-1175, describes techniques for isolating various different functional device types in which the entire array of trench DRAM cells is formed within a surface implanted P-well.

U.S. Pat. No. 4,829,017 issued May 9, 1989 to Malhi describes a method of forming a buried doped layer in a substrate by forming a shallow trench, protecting its sidewalls, further extending the trench and finally doping the walls of the extended trench to form a continuous doped region useful as the storage node of a trench DRAM.

The article "New Well Structure for Deep Submicron CMOS/BiCMOS Using Thin Epitaxy over Buried Layer and Trench Isolation" by Y. Okazaki et al., 1990 Symposium on VLSI Technology, Digest of Technical Papers, paper 6C-4, pp. 83-4, describes the use of buried epitaxial layers to isolate surface devices from the substrate.

The following references relate specifically to variations in SPT DRAM cells in which a buried region of opposite conductivity type from the substrate is used a one plate of the DRAM storage capacitor. U.S. Pat. No. 4,918,502 issued Apr. 17, 1990 to Kaga et al. describes a buried plate trench DRAM cell in which the storage node of the cell and a sheath plate are formed in a single trench. At the bottom of the trench a diffusion of opposite type from the substrate is formed such that the diffusions of adjacent cells interconnect forming a grid-like structure. One or more trenches not associated with a DRAM cell is formed to act as a reach through to enable the doped region to be biased at a suitable reference voltage. FIG. 12, thereof, clearly illustrates the grid-like aspect of the buried region. European published application 0 283 964, published Sept. 28, 1988 describes a buried plate SPT DRAM cell in which an out-diffused region from the DRAM trenches, similar to that in Kaga et al., in which the diffused region forms the plate of the SPT cell. As in Kaga et al. a grid-like region is formed and is contacted by a non-cell trench. U.S. Pat. No. 4,873,560 issued Oct. 10, 1989 to Sunami et al, describes yet another buried plate SPT cell in which the access transistor is formed in the cell trench. FIG. 30, thereof, and its related text, describes the importance of maintaining the grid-like structure of the buried region in order to enable proper operation of the cell transfer device. Sunami et al, further cautions that in the event that opening in the grid-like buried region should be "filled by the depletion layer" isolating the surface devices from the substrate a separate connection can be made to the "isolated" surface region in order to bias it to the same potential as the substrate. UK Patent Application GB 2 215 913 A, published Sept. 27, 1989 describes yet another variation in the buried SPT DRAM cell design in which the dopant for the buried region is provided by ion implantation into the sidewalls of the deep trench of the DRAM cell. Finally, U.S. Pat. No. 4,794,434 issued Dec. 27, 1988 to Pelley, describes a buried plate SPT DRAM cell formed using bipolar device processing methods in which the buried plate region is formed from a buried sub-collector structure normally part of a bipolar transistor.

While the above cited references illustrate the diverse and concentrated efforts made by DRAM designers in attempting to overcome the inherent barriers in continuing to reduce the size, and increase the density, of DRAM cells, none provide the capability to carry DRAM technology into the sub-0.5 micron feature size range, a feat which must be achieved in order to continue the two decade "tradition" of providing ever increasing density of DRAM technology. Out of frustration, DRAM designers have turned to the process-complicating use of "stacked capacitor" DRAM cells only to find such designs extremely cumbersome to the point of being virtually un-manufacturable.

The subject invention addresses the unsolved problems of the prior art by providing solutions to problems presented by extending the manufacturability of the simple SPT cell to 64 Mb DRAM and beyond.

SUMMARY OF THE INVENTION

An object of the invention is to provide a buried plate SPT DRAM cell array in which the density limitations of the prior art are removed.

Another object of the invention is to reduce the complexity of SPT DRAM design to allow process simplicity and thus increased product yield.

Yet another object of the invention is to provide a buried plate SPT DRAM cell which has a minimum impact on existing processing technologies.

The present invention relates to methods for providing a cell design in which all of the historically limiting parameters of DRAM cells are dealt with in a unifying manner to provide a near optimum design in which charge leakage factors are minimized and device bias conditions are optimized. The invention includes a substrate plate trench DRAM cell array in which a buried plate electrode is formed as part of an electrically and physically isolated region in a semiconductor substrate such that the cell transfer device can be operated independently from other support devices formed in the substrate. Sub-half micron feature sizes are used cooperatively with diffusion techniques to provide a simple buried layer formation process impossible at larger feature size dimensions.

These and other objects and features of the invention will become more fully apparent from the several drawings and description of the preferred embodiment.

DESCRIPTION OF THE PREFERRED EMBODIMENT

Figure 1:
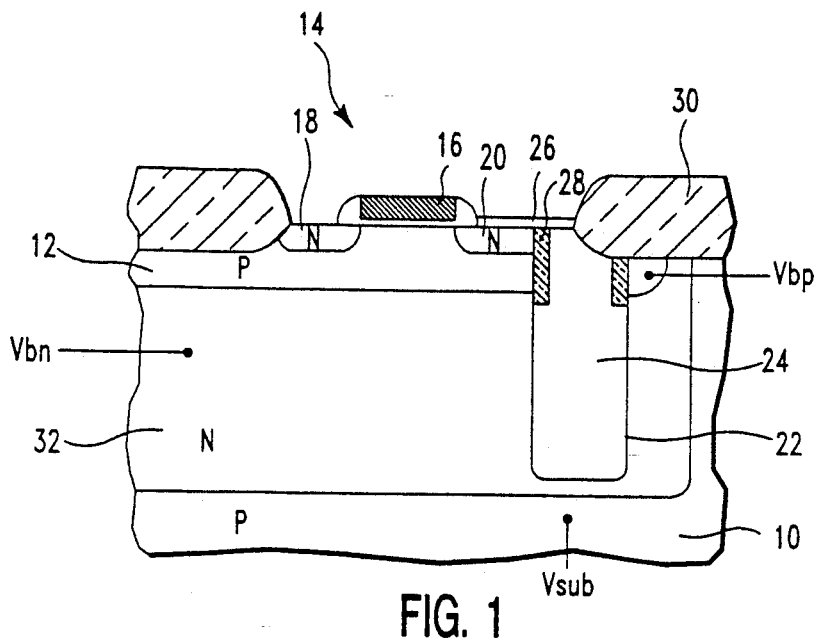
FIG. 1 is a simplified schematic sectional view of a substrate plate trench (SPT) DRAM cell of the invention illustrating the basic electrical connections of the cell.

Referring to FIG. 1, there is shown the basic elements of the Buried Plate Trench SPT of the invention. The cell is an improvement of the prior art SPT DRAM cell as described by Lu et al. in U.S. Pat. No. 4,688,063 and as modified by Kenney in U.S. Pat. No. 4,801,988, both of which are incorporated herein by reference. The cell includes the following major features. A substrate 10 of P-type semiconductor has an P-type well 12 formed at its upper surface into which N-channel transfer devices 14 are formed. A control gate electrode 16 of device 14 is responsive to a word access line of the DRAM array support circuits, not shown, to couple data between data or bit line diffused N-type region 18 and diffused N-type storage node region 20 through the channel region formed in P-well 12. In a manner similar to the prior art, a storage capacitor is formed in a deep trench 22 adjacent to the storage node 20 and includes a signal storage node formed by conductive N-type polysilicon electrode 24 isolated from substrate 10 by a thin dielectric layer. Diffused surface storage node 20 and signal storage node region 24 in the trench 22 are connected by a conductive strap 26. At the top of the storage trench a thick insulating collar 28 is provided to increase the threshold voltage of the vertical parasitic FET formed by the diffused storage node 20 and the substrate within the P-well 12. Local surface isolation 30 is provided, as desired to define active device regions of the surface of the substrate.

With the exception of the semiconductor type of the substrate 10, the cell has similar attributes as the N-channel variant of the prior art SPT DRAM cell. However, a buried N-type layer 32 is additionally provided to act as the reference voltage node region for the trench capacitor. Unlike prior art buried plate trench DRAM cells, the buried layer 32 of the invention forms an electrical and physical isolation means between the surface well 12 in which the transfer devices are formed and the semiconductor substrate 10 in which one or more DRAM cell arrays and support circuits are formed. Thus, buried layer 32 and its two p-n junctions provide a means to independently bias, by way of reference voltage Vbn, not only the plate reference voltage node for the array cells, but also the local substrates of both N- and P-channel devices used in support devices and the transfer devices 14 of the DRAM cells. It will be recognized, that the local substrate region of the cell transfer device 14 can be independently biased by reference voltage Vbp. Similarly, the substrate bias Vsub can be independently established to bias devices which may not be formed in a P-type well.

Although other buried plate trench DRAM cells have been described in the prior, they were proposed in photolithographic environments which made implementation of the invention all but impossible.

It is an important aspect of the invention to provide arrays of cells as described in connection with FIG. 1 in a simple easy to manufacture processing sequence.

Figure 2:
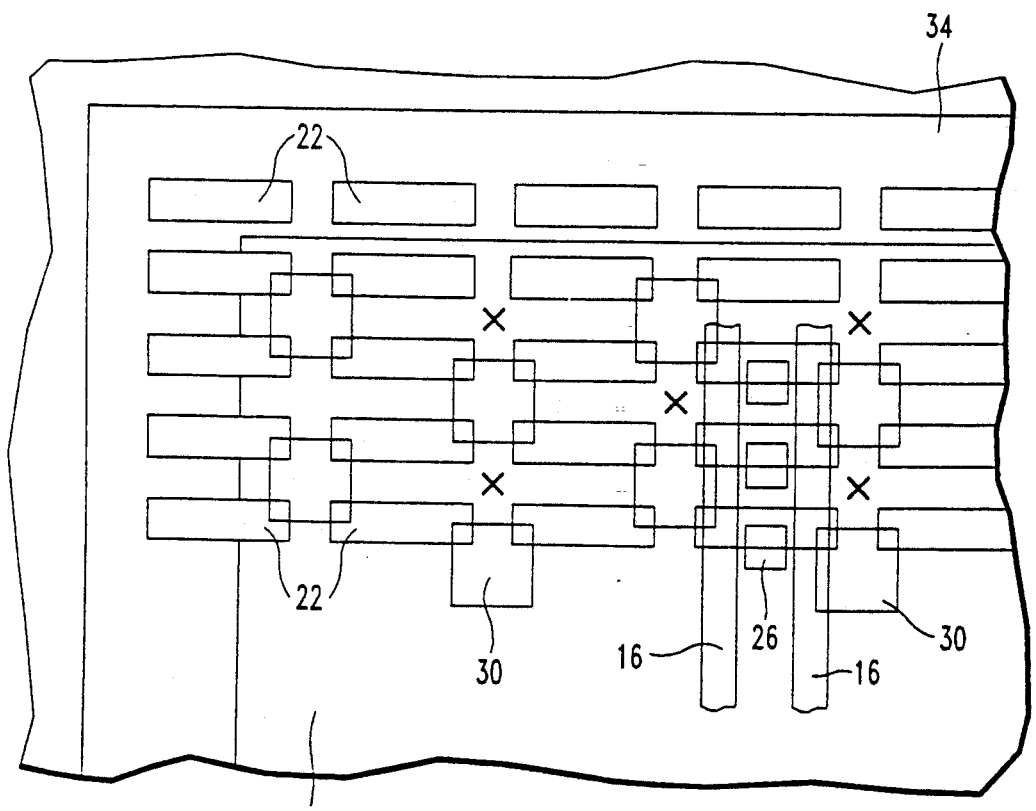
FIG. 2 is a plan view of a corner of an array of the invention schematically illustrating the relationship of the various device layout patterns used in forming the array cells.

Referring now to FIG. 2 there is shown a plan view of a portion of one corner of an array of DRAM cells made in accordance with the invention. Formed within the surface of semiconductor substrate 10 is a matrix of array trenches 22 in a simple rectangular area. The periodicity of the trenches is about 1.7 microns by 0.85 microns. Trenches 22 are about 1.3 by 0.45 microns providing about 0.40 microns horizontal and vertical spacing between trenches. The layout of elements for each cell is similar to that shown in FIG. 6 of my U.S. Pat. No. 4,801,988, although the use of other layout configurations can be provided for open bit line or quarter pitch folded bit line configurations.

Located at the corners of four adjacent trenches is a square region of local surface isolation 30 which serves to isolate the bit line contact diffusions 18, not specifically illustrated. Isolation regions 30 are provided in alternate rows and columns across the matrix. Passing adjacent to the isolation regions in a vertical direction are a plurality of transfer device word lines 16, partially illustrated at the lower right of FIG. 2. Between word lines 16 on the lower edge of each cell trench is the surface strap 26. Overlying the entire array are metal bit lines, not shown, which run horizontally between trenches and make contact to diffused bit line regions 18 as indicated schematically by the large Xs.

In order to ensure that the buried plate region 32, not visible in FIG. 2, is both electrically and physically isolated from other regions of the substrate outside of the array matrix, a surface diffused N-type reach through region 34 is provided around the entire array region. Reach through region 34 is formed at the same time as the N-well region used for P-channel devices in other areas of the substrate. Similarly, the P-well region 12 used in the array is formed at the same time as the P-well region used for N-channel devices in other areas of the substrate. Thus, with the exception of the buried N-type region 32, no additional processing steps are required to form the remainder of the DRAM cell. In order to assure overlap of the N-well reach through region 34 with the buried region 32, the outer one or two rows of deep trenches 22 are non-functional as DRAM cell trenches, as will become evident when the formation of buried region is described, below.

As can be seen, the buried isolation region of the substrate is formed of a first sub-region 32 which is formed by the lateral out diffusion from the trenches 22 and a second sub-region 34 formed as a reach through from the surface of the substrate to contact the top of the buried sub-region 32. Because of the high density of the structures on the substrate, the sub-half-micron lateral spacing between trenches allows the out diffusion from the trenches to merge forming one continuous buried layer in which the impurity concentration is maintained at a high level.

Reference is now made to FIGS. 3–12 which describe the preferred process sequence used to fabricate the diffused buried plate trench DRAM cell array.

Figure 3:
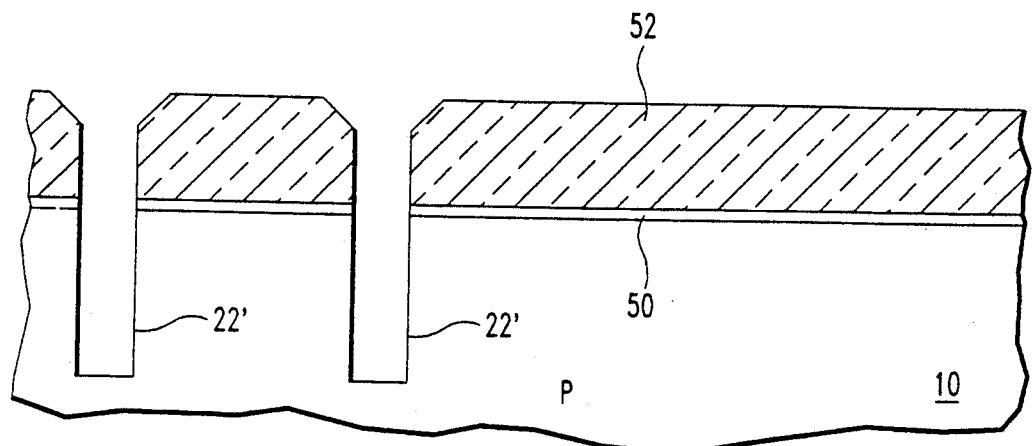
FIGS. 3-12 are schematic sectional views of the array of the invention illustrating the array at various steps in a preferred manufacturing process.

Referring to FIG. 3, starting with a P-type semiconductor wafer of about 1–2 ohm-cm resistivity, an oxide/nitride layer 50 having a thickness of about 175 nm is formed on substrate 10 to act as an etch/polish stop to be used in subsequent steps. A relatively thick, about 500 nm, layer 52 of oxide is deposited by a conventional CVD TEOS technique to act as an etch mask for trenches 22. A photolithographic mask is formed using a high resolution photoresist and is used to define the pattern of trenches 22 which are to be etched in substrate 10. The mask pattern is transferred to the thick oxide layer 52 and the oxide/nitride layer 50 by a dry plasma etching process using oxygen and carbon tetrafluoride (CF4) as the active agents. After stripping the photoresist, trenches 22' are etched to a depth of about 1.5 microns using a anisotropic RIE process in an Applied Materials 5000 etch tool to provide the structure shown in FIG. 3.

Figure 4:
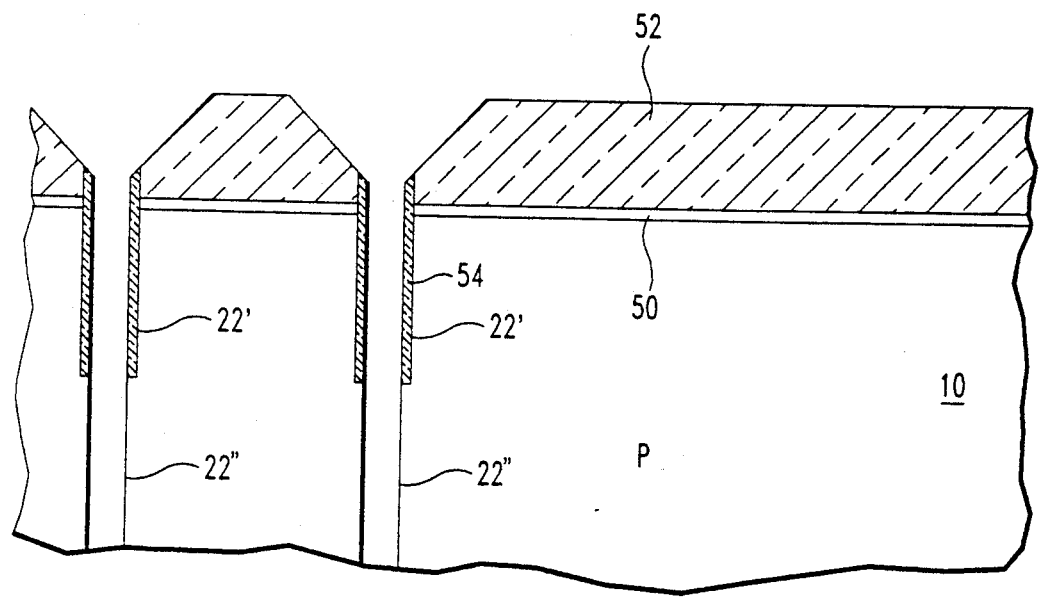

Next, as shown in FIG. 4, a diffusion barrier collar is formed in the initially etched trench 22' by depositing a conformal layer of TEOS CVD oxide to a thickness of about 20 nm followed by a conformal layer of silicon nitride of about 35 nm. The thickness of deposited diffusion collar layers is chosen to provide optimum thickness to act as a diffusion barrier and need not be that required for the collar dielectric 28 in the completed cell. Consideration is also given to provide a minimum thickness of material inside trench 22' in order to provide a maximum area of the yet to etched deep trench. The partially processed substrate is then exposed to an oxygen/CF4 RIE etch to remove the deposited layer on all horizontal surfaces, including the bottom of trenches 22', to provide a sidewall spacer 54 inside trenches 22'. Next, an RIE directional etch is used to etch the deep trenches 22" into the substrate to a depth of about 5 microns, resulting in the structure shown in FIG. 4.

Figure 5:
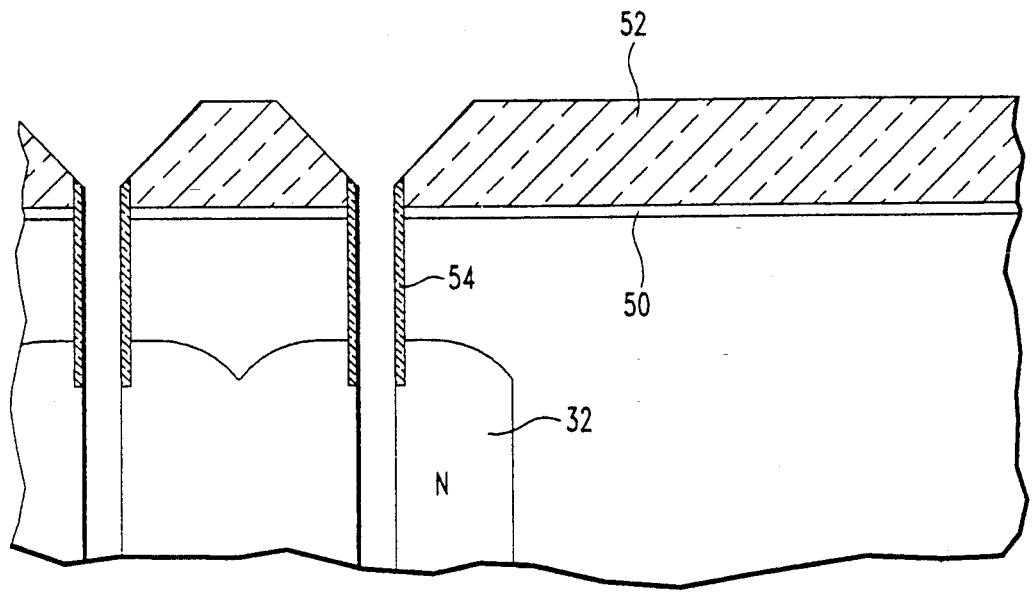

Referring to FIG. 5, the buried plate region 32 is formed by deposition of about 50 nm of a conformal layer of arsenic doped glass deposited by a CVD technique to provide a dopant source for the subsequent thermal diffusion step. A conventional thermal drive-in step is carried out at about 1050 degrees C. to cause the arsenic in the doped glass to be diffused into the substrate 10. The lateral diffusion depth of arsenic in the substrate should be about 0.5 microns to ensure that all of the lateral space between trenches is completely doped. The doped surface concentration at the surface of the trench sidewalls should be about 2E19 atoms per cubic centimeter. Although the spacing of trenches illustrated in the figures is exaggerated, it should be understood that the maximum spacing of trenches is about 0.45 microns. After the drive-in, the arsenic doped oxide layer is stripped using buffered HF in the standard manner, resulting in the structure of FIG. 5. In order to remove any residual RIE etch damage to the sidewalls of the deep trenches, a thin sacrificial oxide may be grown on the inside of the trenches.

After formation of the buried plate region, the remaining thickness of masking oxide layer 52 and the diffusion barrier collar 54 is removed using hot phosphoric acid for the outer nitride layer and buffered HF to remove the sacrificial oxide inside of the trenches.

Figure 6:
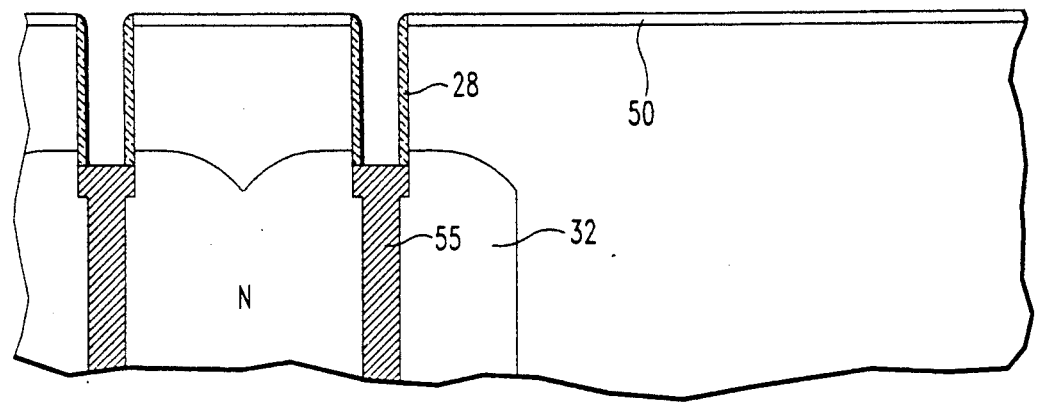

Next, the trench capacitor structure is formed by thermally oxidizing the now exposed silicon sidewalls and bottom of the trenches to a thickness of about 4 nm. Then, about 7 nm of silicon nitride is conformally deposited. The nitride layer is then oxidized to form about 1.5 nm silicon dioxide to complete the ONO cell node dielectric. The trenches are then filled by conformally depositing polysilicon doped to at least 1E19 atoms/cubic centimeter to a thickness of about 900 nm above the surface of the substrate. A thermal anneal step at about 1000 degrees C. in nitrogen heals any inadvertent seams formed in the polysilicon in the deep trenches 22. A RIE process selective to doped polysilicon then removes all of the polysilicon on the planar areas of the substrate and etches into the polysilicon at the tops of the trenches to a level of about 1 micron below the surface of the substrate leaving doped polysilicon 55 in the bottom of the trenches. The trench collar 28 is then formed on the sidewalls of the exposed trench tops by conformally depositing CVD of about 90 nm of silicon dioxide and then anisotropically etching the oxide from planar areas, including the bottoms of the trenches, to leave a collar 28 on the upper sidewalls of the recessed trenches in a manner similar to that in U.S. Pat. No. 4,801,988. The resulting structure is shown in FIG. 6.

Figure 7:
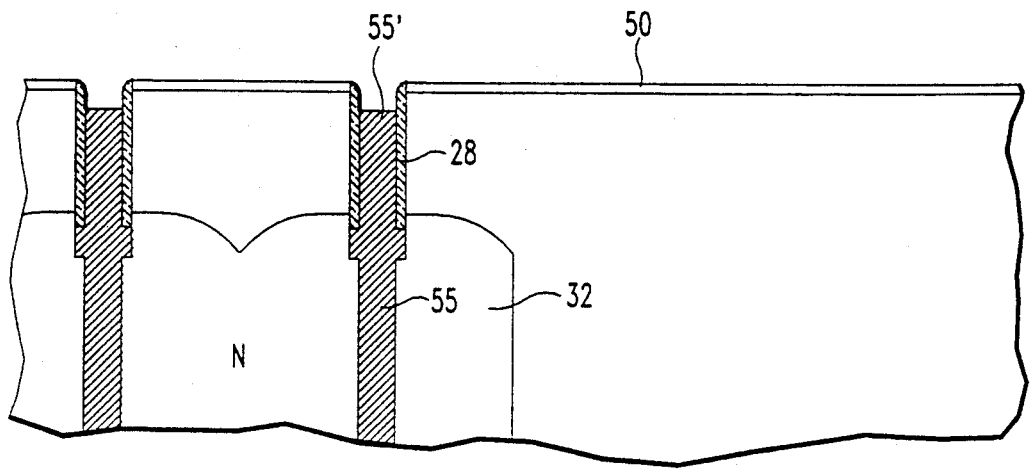

Referring now to FIG. 7, the trenches are again filled with arsenic doped polysilicon to a surface thickness of about 600 nm and annealed, as above. Then all of the thus deposited polysilicon formed on the back side of the substrate is removed preferably by a planarizing process such as chemical-mechanical polishing in order to reduce any undesirable stress caused by this nonfunctional layer. The front, or trench containing side, of the substrate is then planarized to remove the last deposited 600 nm of polysilicon from all planar surfaces. In order to achieve superior planarity, it is preferable to use a chemical-mechanical polishing technique. Such techniques are described in greater detail in U.S. Patent 4,944,836 to Beyer et al. and U.S. Pat. No. 4,789,648 to Chow et al. Next, polysilicon 55' in the top of the trenches is recessed about 50 nm to 100 nm below the substrate surface in order to prevent subsequently applied polysilicon word lines from shorting to the signal storage node of the trench capacitors. The resulting structure is shown in FIG. 7.

Figure 8:
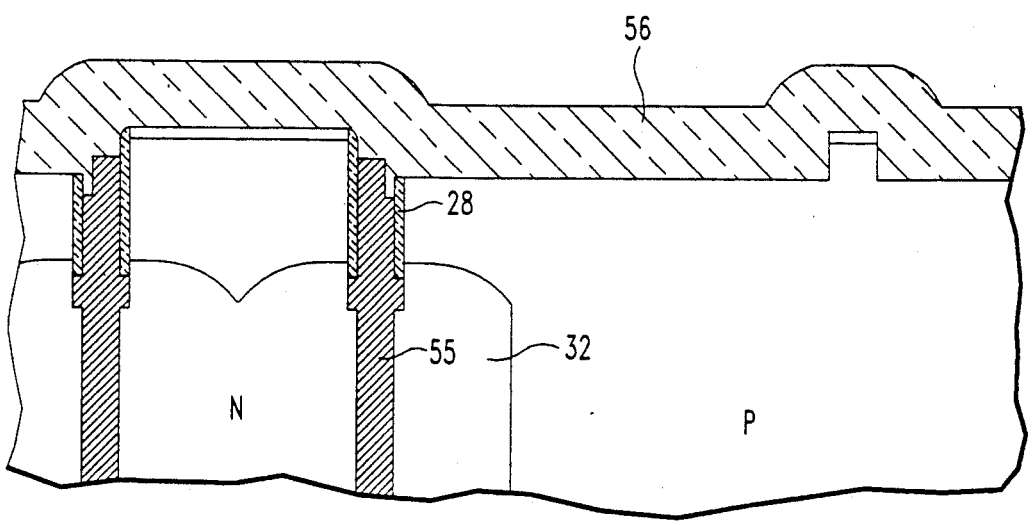

Next the local isolation in the form of shallow trench isolation (STI) is formed, shown in FIG. 8. An STI mask is applied to the substrate and defines all of the regions where STI is desired. The exposed oxide/nitride etch stop layer 50 is etched to expose the silicon substrate surface and overlapped polysilicon filled trench tops. Preferably in the same processing chamber, the exposed substrate, trench collar and polysilicon are etched to a depth of about 350 nm. A LPCVD TEOS oxide layer 56 of about 630nm is then conformally deposited over the entire substrate as shown in FIG. 8.

Figure 9:
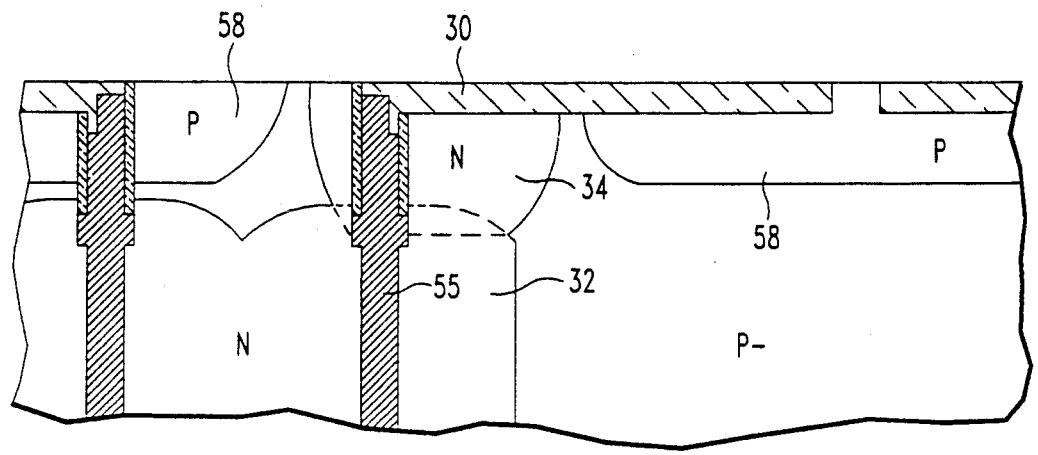

Next, as shown in FIG. 9 STI oxide layer 56 is planarized, preferably by a combination of RIE etch-back and chemical-mechanical polishing as described in co-pending application 07/427,153 filed Oct. 25, 1989 entitled "Forming Wide Dielectric-filled Isolation Trenches in Semiconductors" by Kerbaugh et al. Next, any remaining oxide/nitride layer 50 is removed by hot phosphoric acid and buffered HF. At this point, a sacrificial oxide may be grown on the exposed substrate surfaces, as these will become the active device areas for N- and P-channel devices of the CMOS process into which the array of the invention is integrated.

Next, N-wells for P-channel devices and for contacting the buried N-type plate region 32 are formed by the conventional use of an N-well mask which covers all of the substrate except where N-wells are desired. After formation of the N-well mask, the substrate is exposed to a plurality of ion implantation steps to form retrograde N-wells 34. Phosphorus ions are implanted at about 900 KEV with a dose of about 5E13 atoms per square centimeter to form the higher concentration deepest portion of the well, at about 500 KEV with a dose of about 2.3E13 atoms per square centimeter to form the bulk of the well and at about 150 KEV with a dose of about 1.9E12 atoms per square centimeter to control punch through. If desired an additional N-well mask can be used at this point to selectively implant arsenic at about 80 KEV with a dose of about 1.3E12 atoms per square centimeter to control the threshold voltage of the P-channel FETs formed in selective N-wells. Additional implant masks and implants may also be used to further tailor specific device threshold voltages.

Following the formation of the N-wells, a conventional P-well mask is formed in a similar manner in order to mask the substrate against boron ions used to form the P-wells 58, also shown in FIG. 9. To form the P-wells, boron ions are implanted at about 200 KEV with a dose of about 8E12 atoms per square centimeter to form the bulk of the well, at about 80 KEV with a dose of about 1.6E12 atoms per square centimeter to control punch through region and at about 7.3 KEV with a dose of about 3.7E12 atoms to control the threshold voltage of the N-channel FETs used in the array and support circuitry of the DRAM. Thus, the structure in FIG. 9 results. It will be clear from the above description, that the N-well regions 34 make physical contact with the buried plate region 34 surrounding the deep trenches to ensure both electrical and physical isolation of all of the transfer devices associated with DRAM cells. Unlike the prior art, there is no need to ensure that the substrate regions of the transfer devices can be electrically coupled to the semiconductor substrate 10.

Figure 10:
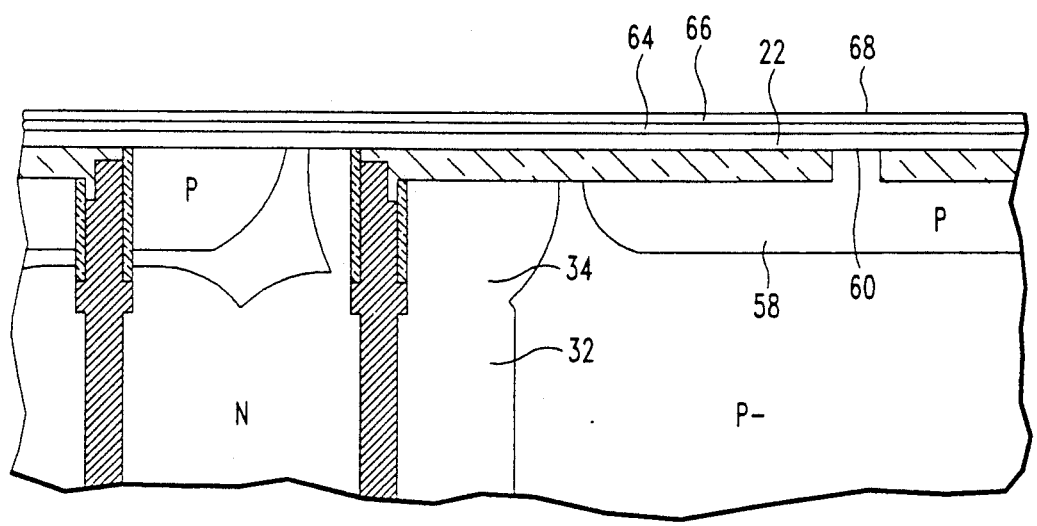

Next, the gate stack structure comprising the gate insulator, a conductive gate and a silicon nitride cap is formed as shown in FIG. 10. After stripping the sacrificial oxide referred to above, a gate insulator layer 60 is formed by growing about 10 nm of silicon dioxide on the exposed silicon surfaces of the substrate. A polysilicon layer 62 of about 200 nm is deposited and doped by ion implanting phosphorus at about 25 KEV with a dose of about 6E15 atoms per square centimeter. This is followed by deposition of about 100 nm of titanium silicide layer 64 by sputtering to reduce the resistivity of the wordlines. The gate stack is completed by depositing a layer 66 of silicon dioxide and a layer 68 of silicon nitride of about 80 nm resulting in the structure shown in FIG. 10.

Figure 11:
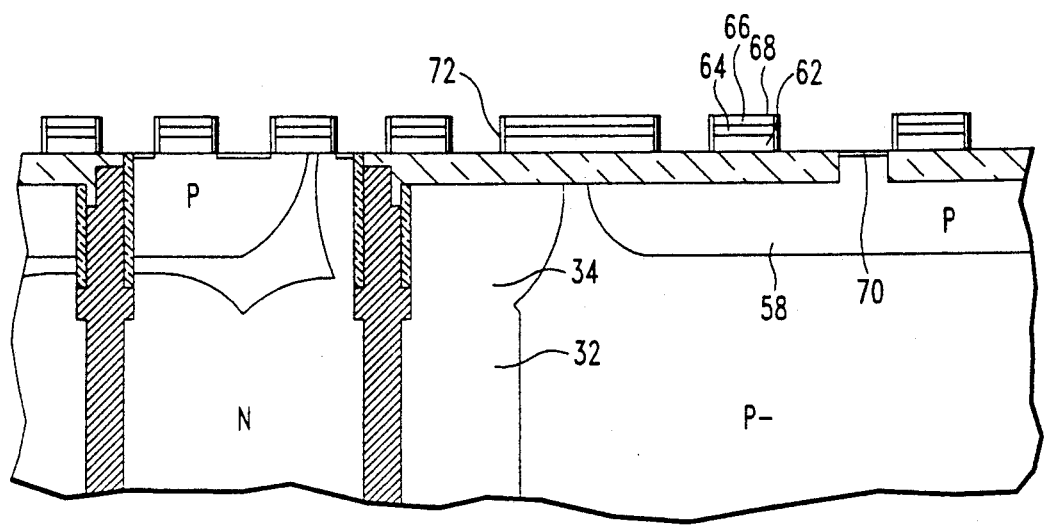
Figure 12:
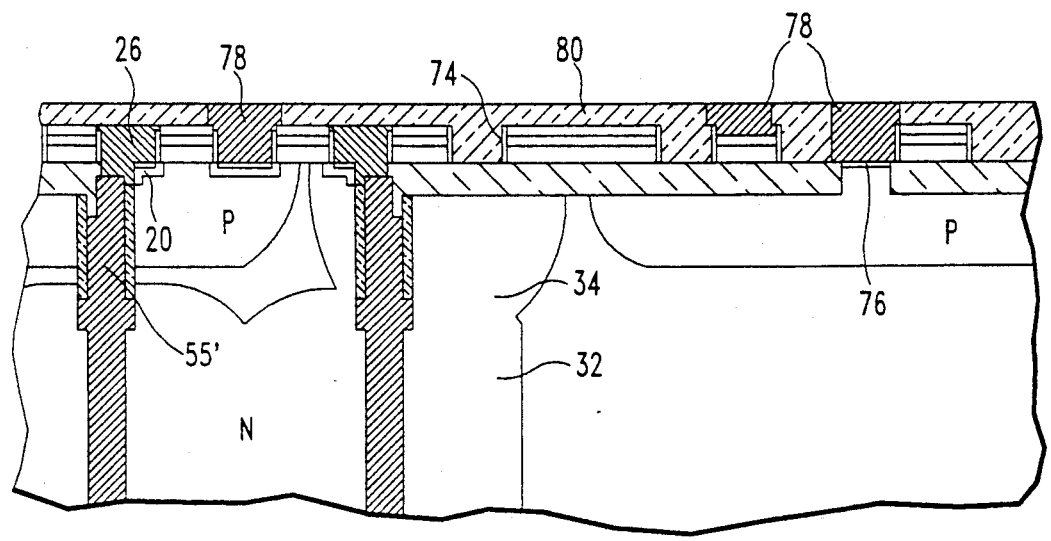

As shown in FIG. 11, the multilayer gate stack is selectively etched to define the first level of interconnect and the gate electrodes for the CMOS FET devices to be formed on the planarized substrate. The exposed polysilicon is oxidized sightly at about 1050 degrees C. Next, a blocking mask is used to protect all of the device regions except where N-channel FETs are to be formed. A lightly doped N-type region 70 is then formed by implanting phosphorus at about 30 KEV with a dose of about 1E14 atoms per square centimeter. After removal of the blocking mask, a sidewall spacer 72 is formed by depositing about 45 nm of CVD silicon nitride followed by an anisotropic RIE of nitride present on planar surfaces. Next, the doped regions are silicided in a conventional manner by evaporating about 20 nm of cobalt, annealing at about 750 degrees C. and removing unreacted cobalt in dilute nitric acid.

The devices and DRAM structure are completed by the formation of borderless contacts in a manner similar to the techniques described in U.S. Pat. No. 4,944,682 to Cronin et al. entitled "Method of Forming Borderless Contacts," with the following steps illustrated with reference to FIG. 12. A silicon nitride sidewall 74 is formed by depositing a layer of silicon nitride of about 15 nm followed by an anisotropic RIE step. The N+-type diffusions 76 for NFET devices are formed, after placing a blocking mask to protect PFET regions, by implanting arsenic at about 50 KEV with a dose of about 5E15 followed by a drive-in step in nitrogen at about 900 degrees C. The P+-type diffusions for PFET devices are formed, after placing a blocking mask to protect NFET regions, by implanting boron at about 10 KEV with a dose of about 5E15 atoms per square centimeter. A polysilicon surface strap 26 is formed to connect the N-type diffusions forming the storage node region 20 to the polysilicon 55' at the tops of the deep trenches is formed by the use of a blocking mask exposing the storage node regions, selectively etching the oxide at the trench top, depositing N-type polysilicon and planarizing by a chemical-mechanical polishing process to leave polysilicon straps 26. Interconnects 78 of titanium nitride and tungsten are formed as borderless contacts and an interlevel passivating layer 80 of phosphorus-doped glass is deposited and planarized, again by chemical-mechanical polishing techniques. The DRAM is completed by providing a number of additional planarized interconnect levels, as required by the complexity of the circuits to be interconnected.

While the invention has been described in terms of a single preferred embodiment, those skilled in the art will recognize that many of the steps described above can be altered and that dopant species and types as well as other material substitutions can be freely made without departing from the spirit and scope of the invention.

What is claimed is:

1. A dynamic random access memory device comprising:
    a semiconductor substrate having a first region of a first conductivity type;
    at least one array of dynamic memory cells, each cell comprising an access transistor coupled to a storage capacitor, the transistor of each memory cell being formed within a second region of said semiconductor substrate, each access transistor having a control electrode, a data line contact region, a storage node region, and a channel region;
    a plurality of signal storage capacitors formed in a plurality of trenches in said substrate, each capacitor including a signal storage node region and a reference voltage node region separated by a dielectric insulator, the reference voltage node region being formed on said first region of said substrate and the signal storage node region of each capacitor being connected to a corresponding storage node region of one of said access transistors;
    means for physically and electrically isolating all of the channel regions of said access transistors within said one array from said first region of said substrate, said isolating means comprising a third region of opposite conductivity type to said first region, said third region formed laterally between said first and second regions, said third region intersecting and extending below the bottom of all of said trenches; said third region comprising said reference voltage node region having a substantially constant impurity doping concentration throughout its depth and said third region comprising an isolation region extending substantially around said array and extending between said reference voltage node region and a surface of said semiconductor substrate; and
    means for biasing said first, second and third regions of said substrate to first, second and third different reference voltages.

2. The dynamic random access memory device of claim 1 wherein the reference voltage node region of said third region has an impurity doping level which exceeds that of the first region of said substrate.

3. The dynamic random access memory device of claim 2 wherein the impurity type of said first region is P-type.

4. The dynamic random access memory device of claim 3 wherein the dopant impurity of said first region is boron and the dopant impurity in the reference voltage node region is arsenic.

5. The dynamic random access memory device of claim 4 wherein the access transistors are N-channel FET devices.

6. A dynamic random access memory device comprising:
    a plurality of deep trenches arranged in a rectangular matrix on the surface of a semiconductor substrate, the spacing between adjacent trenches being substantially equal in both a lateral and transverse direction; a buried plate diffused region being associated with all of said deep trenches;
    each of a first plurality of said deep trenches being associated with a substrate plate trench DRAM cell including a transfer device, a data node and a storage node connected to a capacitor plate formed within a deep trench and coupled to a region of the substrate within the buried plate diffused region;
    each of a second plurality of said deep trenches being contacting with a surface diffused isolation region enclosing the perimeter of the first plurality of said deep trenches and contacting the buried plate diffused region so that the substrate region within the matrix is electrically and physically isolated from the remainder of the substrate.

7. The dynamic random access memory device of claim 6 wherein the buried plate diffused region has a dopant impurity profile which is substantially constant throughout the depth of said buried plate diffused region.

8. The dynamic random access memory device of claim 7 wherein the impurity conductivity type of the substrate is P-type and the impurity conductivity type of the buried plate diffused region and the surface diffused isolation region is N-type.

9. The dynamic random access memory device of claim 8 wherein the impurity in the buried plate diffused region is arsenic.

* * * * *